US011189561B2

(12) United States Patent
Dutta et al.

(10) Patent No.: US 11,189,561 B2
(45) Date of Patent: Nov. 30, 2021

(54) PLACING TOP VIAS AT LINE ENDS BY SELECTIVE GROWTH OF VIA MASK FROM LINE CUT DIELECTRIC

(71) Applicant: International Business Machines Corporation, Armonk, NY (US)

(72) Inventors: Ashim Dutta, Menands, NY (US); Ekmini Anuja De Silva, Slingerlands, NY (US); Dominik Metzler, Saratoga Springs, NY (US); John Arnold, North Chatham, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 192 days.

(21) Appl. No.: 16/574,447

(22) Filed: Sep. 18, 2019

(65) Prior Publication Data
US 2021/0082807 A1    Mar. 18, 2021

(51) Int. Cl.
*H01L 23/48*    (2006.01)
*H01L 23/522*    (2006.01)
(Continued)

(52) U.S. Cl.
CPC .... *H01L 23/5226* (2013.01); *H01L 21/76816* (2013.01); *H01L 21/76879* (2013.01); *H01L 21/76897* (2013.01); *H01L 23/5283* (2013.01)

(58) Field of Classification Search
CPC ......... H01L 21/02167; H01L 21/02211; H01L 21/02274; H01L 21/0228; H01L 21/0337;
(Continued)

(56) References Cited

U.S. PATENT DOCUMENTS 8,852,851 B2 * 10/2014 Zhou ................... H01L 21/3088
430/311
9,418,935 B1    8/2016 Shao et al.
(Continued)

FOREIGN PATENT DOCUMENTS

WO    2017111868 A1    6/2017

OTHER PUBLICATIONS

Yuan, et al., "Study of Cut Mask Lithography Options for Sub-20nm Metal Routing", Proc. of SPIE, Mar. 2015, vol. 9426 (94260J-2; Downloaded From: http://proceedings.spiedigitallibrary.org/ on Mar. 18, 2016 Terms of Use: http://spiedigitallibrary.org/ss/TermsOfUse.aspx; 9 pages.
(Continued)

*Primary Examiner* — Brook Kebede
(74) *Attorney, Agent, or Firm* — Cantor Colburn LLP; Abdy Raissinia

(57) ABSTRACT

Embodiments of the present invention are directed to fabrication method and resulting structures for placing self-aligned top vias at line ends of an interconnect structure. In a non-limiting embodiment of the invention, a line feature is formed in a metallization layer of an interconnect structure. The line feature can include a line hard mask. A trench is formed in the line feature to expose line ends of the line feature. The trench is filled with a host material and a growth inhibitor is formed over a first line end of the line feature. A via mask is formed over a second line end of the line feature. The via mask can be selectively grown on an exposed surface of the host material. Portions of the line feature that are not covered by the via mask are recessed to define a self-aligned top via at the second line end.

18 Claims, 13 Drawing Sheets

(51) Int. Cl.
*H01L 23/528* (2006.01)
*H01L 21/768* (2006.01)

(58) Field of Classification Search
CPC ........... H01L 21/3086; H01L 21/31144; H01L 21/76802; H01L 21/76816; H01L 21/76879; H01L 21/76897; H01L 21/823431; H01L 23/5226; H01L 23/5283; H01L 29/66795
USPC ........................................................ 257/774
See application file for complete search history.

(56) References Cited

U.S. PATENT DOCUMENTS

| | | |
|---|---|---|
| 9,679,781 B2* | 6/2017 | Abatchev .............. H01L 21/306 |
| 10,020,223 B1 | 7/2018 | Anderson et al. |
| 10,115,633 B2 | 10/2018 | Zhang et al. |
| 10,121,875 B1 | 11/2018 | Ho et al. |
| 2006/0046200 A1 | 3/2006 | Abatchev et al. |
| 2014/0284813 A1 | 9/2014 | Greco et al. |
| 2016/0293478 A1 | 10/2016 | Yuan et al. |
| 2017/0033051 A1 | 2/2017 | Hong |
| 2018/0315590 A1 | 11/2018 | Schenker et al. |
| 2018/0323100 A1 | 11/2018 | Nyhus et al. |

OTHER PUBLICATIONS

International Search Report; International Application No. PCT/IB2020/057669; International Filing Date: Aug. 14, 2020; dated Nov. 30, 2020; 10 pages.

* cited by examiner

PLACING TOP VIAS AT LINE ENDS BY SELECTIVE GROWTH OF VIA MASK FROM LINE CUT DIELECTRIC

BACKGROUND

The present invention generally relates to fabrication methods and resulting structures for semiconductor devices, and more specifically, to fabrication method and resulting structures for placing self-aligned top vias at line ends of an interconnect structure by selectively growing a via mask from a line cut dielectric.

The fabrication of very large scale integrated (VLSI) or ultra large scale integrated (ULSI) circuits requires the manufacture of sophisticated interconnect structures including metallic wiring that connects individual devices in a semiconductor chip to one another. Typically, the wiring interconnect network consists of two types of features that serve as electrical conductors, namely, line features that traverse a distance across the chip, and via features that connect lines in different levels. The conducting metal lines and vias are made of conductive material, such as aluminum or copper, and are electrically insulated by interlayer dielectrics (ILD). In a multilayered interconnect structure, the metallization layers are referred to as "M" layers (e.g., M1 layer, M2 layer, etc.) while "V" layers denote the vias placed between adjacent M layers (e.g., V1 is between the M1 and M2 layers).

To increase the number of circuits that can be provided on a chip, the semiconductor industry has repeatedly shrunk the transistor gate length and the chip size. As a consequence, the interconnect structure that forms the metallic circuitry has also shrunk. As integrated circuit (IC) feature sizes continue to decrease, the aspect ratio, (i.e., the ratio of height/depth to width) of features such as vias generally increases, complicating the manufacturing process. Fabricating intricate structures of conductive interconnect layers and high aspect ratio vias within increasingly smaller wafer footprints is one of the most process-intensive and cost-sensitive portions of semiconductor IC fabrication.

SUMMARY

Embodiments of the invention are directed to a method for forming self-aligned top vias at line ends of an interconnect structure. A non-limiting example of the method includes forming a line feature in a metallization layer of the interconnect structure. The line feature can include a line hard mask. A trench is formed in the line feature to expose line ends of the line feature. The trench is filled with a host material and a growth inhibitor is formed over a first line end of the line feature. A via mask is formed over a second line end of the line feature. The via mask can be selectively grown on an exposed surface of the host material. Portions of the line feature that are not covered by the via mask are recessed to define a self-aligned top via at the second line end.

Embodiments of the invention are directed to a method for forming self-aligned top vias at line ends of an interconnect structure. A non-limiting example of the method includes forming a line feature in a metallization layer. The line feature can include two or more line ends. A region between a first line end and a second line end is filled with a host material and a growth inhibitor is formed over the first line end. A via mask is selectively grown over an exposed surface of the host material. Portions of the line feature that are not covered by the via mask are recessed to define a self-aligned top via at the second line end.

Embodiments of the invention are directed to a semiconductor structure. A non-limiting example of the semiconductor device includes a line feature in a metallization layer of an interconnect structure. A plurality of self-aligned top vias are formed at line ends of the line feature. The self-aligned top vias include a same critical dimension. The critical dimension is not subject to lithographic variation.

Embodiments of the invention are directed to a semiconductor structure. A non-limiting example of the semiconductor device includes a line feature in a metallization layer of an interconnect structure. The line feature includes a first line end and a second line end. A trench is adjacent to the first line end of the line feature. The trench includes a host material. A first top via is formed at the first line end of the line feature. The first top via includes a first critical dimension. A second top via is formed at the second line end of the line feature. The second top via includes the first critical dimension. The first critical dimension is not subject to lithographic variation.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
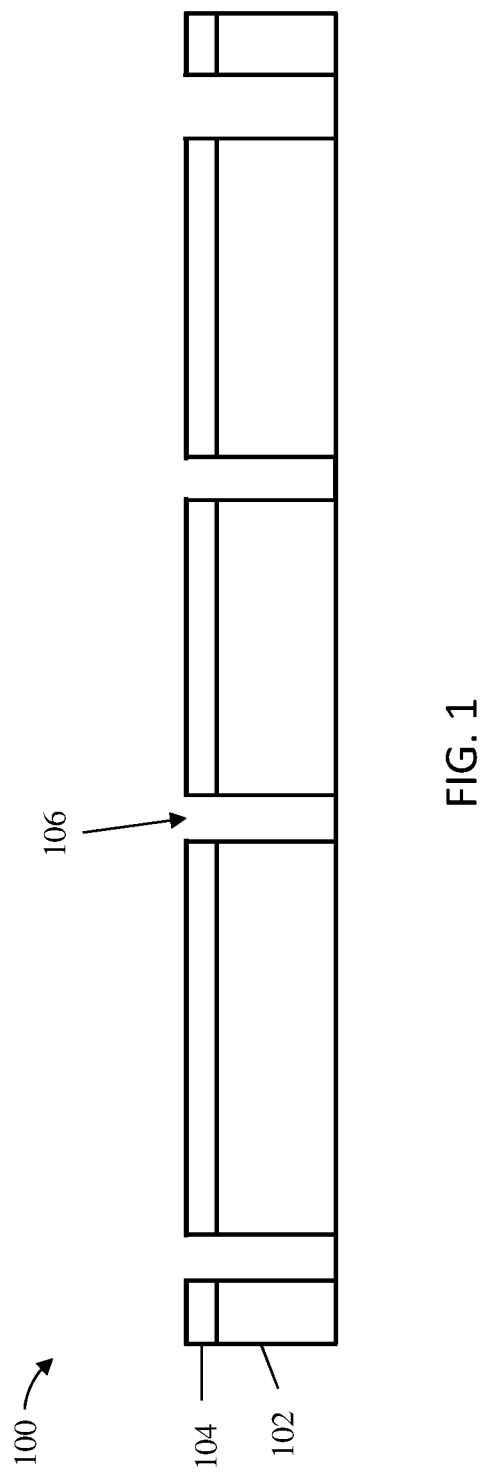
FIG. 1 depicts a cross-sectional view of a semiconductor structure after an initial set of processing operations according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another.

Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

The continued scaling of semiconductor devices has resulted in challenging fabrication requirements, especially when fabricating ever smaller metallization layers. Advanced masks that incorporate phase-shifting and optical proximity correction have been employed in an effort to satisfy these scaling demands. These techniques, however, are subject to overlay errors between features in the interconnect structure that can lead to reliability issues in the final device. Overlay errors result from misalignment during the lithography process as the mask invariably becomes misaligned with the underlying structure. Although overlay errors can be mitigated by reworking the lithography operations, some level of overlay error is unavoidable, resulting in feature misalignments between the metallization layers.

One of the challenges in fabricating advanced metallization layers is the difficulty in forming uniform vias at line ends (so called top vias) without any variation in via critical dimension (CD). The CD of a feature (interconnect line, contact, via, trench, etc.) refers to the smallest geometrical dimension for that feature that can be formed (e.g., for a via the CD refers to the via width). Via CD uniformity is especially difficult to achieve if via alignment to the line features is done using lithography, due to the lithography limitations discussed previously. In particular, a finite overlay shift (misalignment) can cause a via to either move away from a target line end or to be cut off by the line end, causing a CD reduction in the via. As the overlay shift will not be the exact same from via to via (some will be moved away from their respective target lines while others will be cut off by different amounts), variations in via CDs are common.

Turning now to an overview of aspects of the present invention, one or more embodiments of the invention address the above-described shortcomings of the prior art by providing a new semiconductor structure and a method for placing self-aligned top vias at line ends by leveraging the selective growth of a via mask from a line cut dielectric.

In some embodiments of the invention, line features (metal lines and line hard masks) are first cut using lithography and an etch. The cuts are then filled with a host material selected for a subsequent selective growth process. The host material further selected to be a non-dielectric and wets removable (e.g. TiN or TiOx). As used herein, a "wets removable" material refers to a material that is removable using a wet etch. A lithographically patterned mask is used to cover lines that will have a via at one or both line ends and a growth inhibitor is applied to the lines exposed by the mask. The growth inhibitor grafts on exposed dielectrics, but not on to the host material (e.g., a metal containing cut fill material), leaving a surface of the host material exposed. A selectively grown via mask is formed (deposited) on the exposed host material.

The via mask can be a metal or dielectric (depending on the host material, e.g. TaN, TiN, Ta, Ti, W, etc.) that is grown using a precise number of growth cycles selected to target a specific via dimension. The growth inhibitor will prevent the via mask material from growing at line ends where a via is not needed. The growth inhibitor is removed and the lines are recessed (e.g., etched) selective to the via mask to form self-aligned top vias at one or more line ends. The via mask, line hardmask, and host material is then removed and replaced with dielectrics.

Advantageously, vias formed using the selective growth of a via mask in this manner can be self-aligned to one end or both ends of the metal lines. The via CD variations which would otherwise arise from lithographically aligning the via to a previously-formed line cut are avoided. Instead, the via CD at each line end is controlled by the amount of lateral growth of the via mask, which can be well-controlled using a precise number growth cycles to target a specific via dimension. This greatly improves the fabrication accuracy for top vias, even allowing top vias at extreme ends of lines (which is not possible using conventional lithography). In other words, the present invention provides for top vias having invariant via widths (an invariant critical dimension that is not subject to lithographic variation).

Turning now to a more detailed description of aspects of the present invention, FIGS. 1-11 depict cross-sectional views of an interconnect structure 100 after an initial set of fabrication operations according to one or more embodiments of the invention. In FIG. 1, known fabrication operations have been used to form the interconnect structure 100 such that it includes a line feature 102, a line hard mask 104, and trenches 106, configured and arranged as shown. While not shown for ease of discussion, the line feature 102 can be one of many lines in a metallization layer of an interconnect structure. The processes described herein with respect to the line feature 102 can be used to create self-aligned vias in any of these metallization layers.

In some embodiments of the invention, the line feature 102 includes a conductive material formed or deposited in a trench of a metallization layer using known BEOL processes. In some embodiments of the invention, the line feature 102 is overfilled above a surface of the trench (not shown), forming overburdens that can be removed using, for example, a chemical-mechanical planarization (CMP) process. The line feature 102 can be made of any suitable conducting material, such as, for example, metal (e.g., tungsten, titanium, tantalum, ruthenium, zirconium, cobalt, copper, aluminum, platinum), alloys thereof (such as AlCu, CuMn, CuTi, or the like), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the line feature 102 is a ruthenium line. The line feature 102 can be formed or deposited using, for example, CVD, PECVD, PVD, sputtering, plating, chemical solution deposition, and electroless plating.

In some embodiments of the invention, the line hard mask 104 is deposited or formed on a top surface of the line feature 102. The line hard mask 104 can be formed using any suitable process, such as chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), flowable CVD, spin-on dielectrics, physical vapor deposition (PVD), molecular beam epitaxy (MBE), chemical solution deposition, spin-on dielectrics, or other like process. The line hard mask 104 can be made of any suitable dielectric material, such as, for example, a low-k dielectric, a nitride, silicon nitride, silicon oxide, SiON, SiC, SiOCN, or SiBCN. In some embodiments of the invention, the line hard mask 104 is a silicon nitride or silicon oxide hard mask. In some embodiments of the invention, the line hard mask 104 is formed to a thickness of about 10 nm to about 60 nm, for example 30 nm, although other thicknesses are within the contemplated scope of the invention.

In some embodiments of the invention, the line hard mask 104 is formed over a plurality of line features (including the line feature 102). In some embodiments of the invention, the line hard mask 104 is formed of a same material on all of the line features. In some embodiments of the invention, even and odd line features can include a same or different material for the line hard mask 104. For example, an even line can include SiN and an odd line can include SiOx/SoG, or vice versa.

As further shown in FIG. 1, portions of the line feature 102 and the line hard mask 104 can be removed (cut or patterned) using a lithographic process to form one or more trenches 106. In some embodiments of the invention, portions of the line feature 102 and the line hard mask 104 are removed using a wet etch, a dry etch, or a combination of sequential wet and/or dry etches. In some embodiments of the invention, portions of the line feature 102 and the line hard mask 104 are removed using reactive ion etching (RIE). The positioning of the trenches 106 (the line cuts) defines one or more line ends of the line feature 102. As used herein, a line end refers to the portion (sidewall) of a line feature that is directly adjacent to a cut (e.g., the trenches 106).

Figure 2:
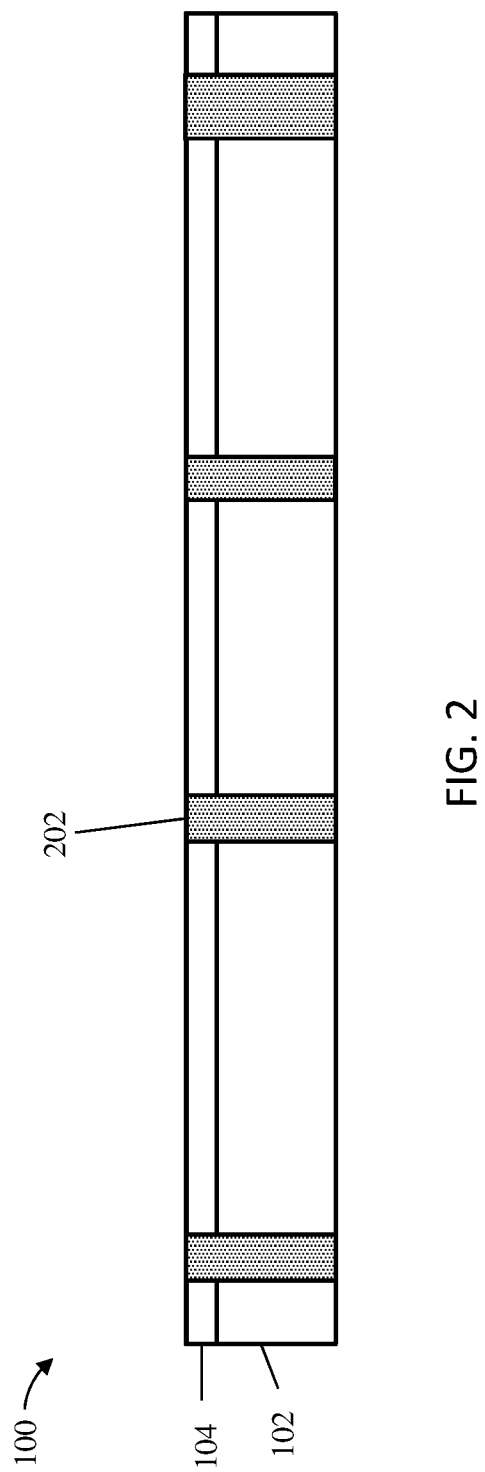
FIG. 2 depicts a cross-sectional view of the semiconductor structure after additional processing operations according to one or more embodiments of the invention.
Figure 6:
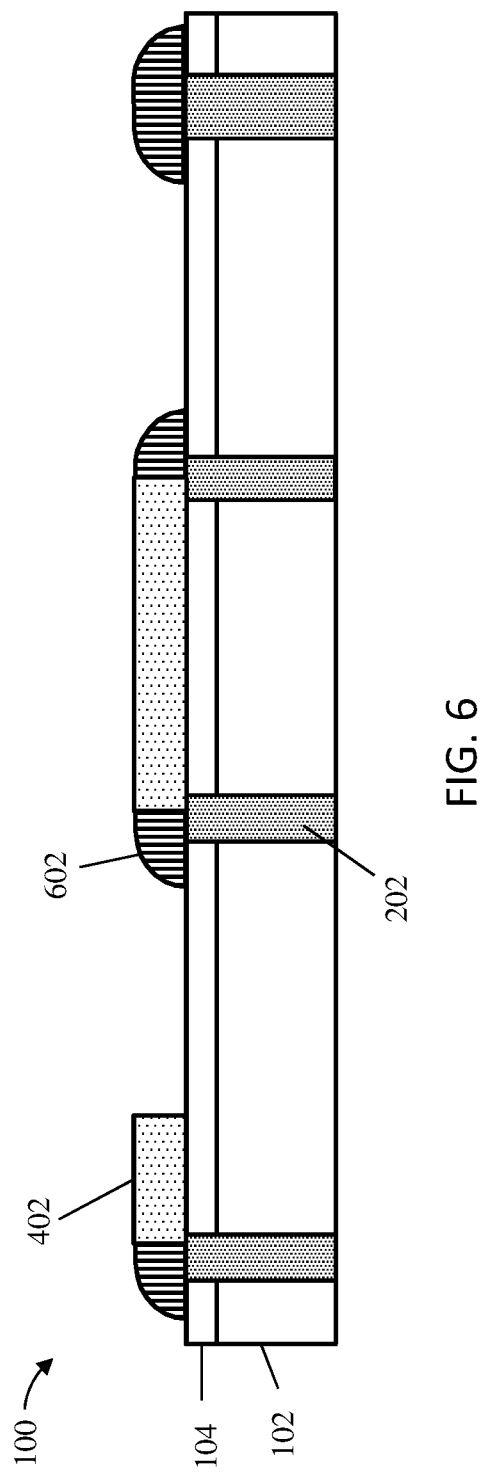
FIG. 6 depicts a cross-sectional view of the semiconductor structure after additional processing operations according to one or more embodiments of the invention.

FIG. 2 depicts a cross-sectional view of the interconnect structure 100 after a processing operation according to one or more embodiments of the invention. In some embodiments of the invention, the trenches 106 are filled with a host material 202. As discussed previously, the host material can be selected to provide a suitable surface for a subsequent selective growth process (FIG. 6).

In some embodiments of the invention, the host material 202 is further selected to be a non-dielectric and wets removable. In some embodiments of the invention, the host material 202 includes TiN, TiOx, TaN, etc. In some embodiments of the invention, the host material 202 is overfilled above a surface of the line hard mask 104, forming overburdens that can be removed using, for example, CMP. The host material 202 can be formed or deposited in the trench 106 using, for example, CVD, PECVD, PVD, sputtering, plating, chemical solution deposition, and electroless plating.

Figure 3:
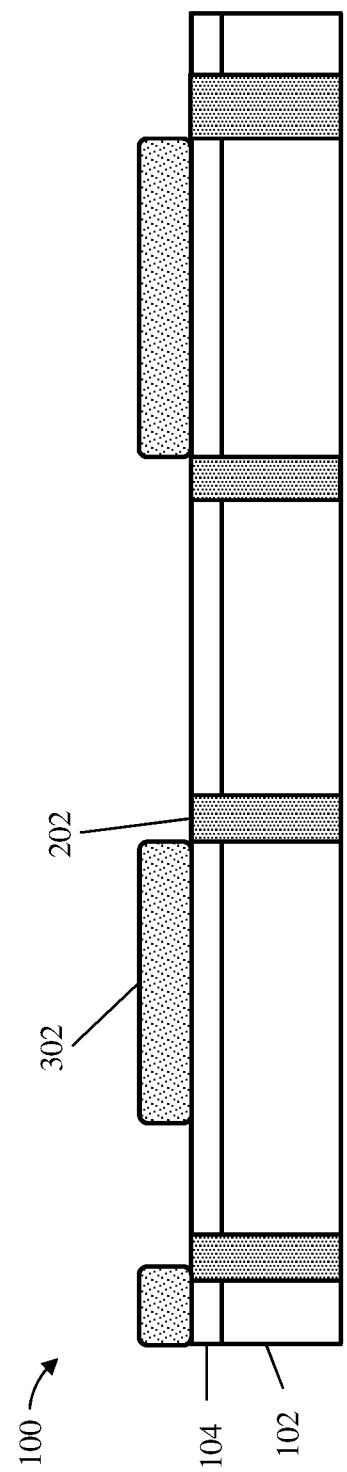
FIG. 3 depicts a cross-sectional view of the semiconductor structure after additional processing operations according to one or more embodiments of the invention.

FIG. 3 depicts a cross-sectional view of the interconnect structure 100 after a processing operation according to one or more embodiments of the invention. In some embodiments of the invention, a lithographically patterned mask 302 is formed over the line hard mask 104. In some embodiments of the invention, the lithographically patterned mask 302 is patterned to only cover portions of the line feature 102 near a line end where a via is desired.

Figure 4:
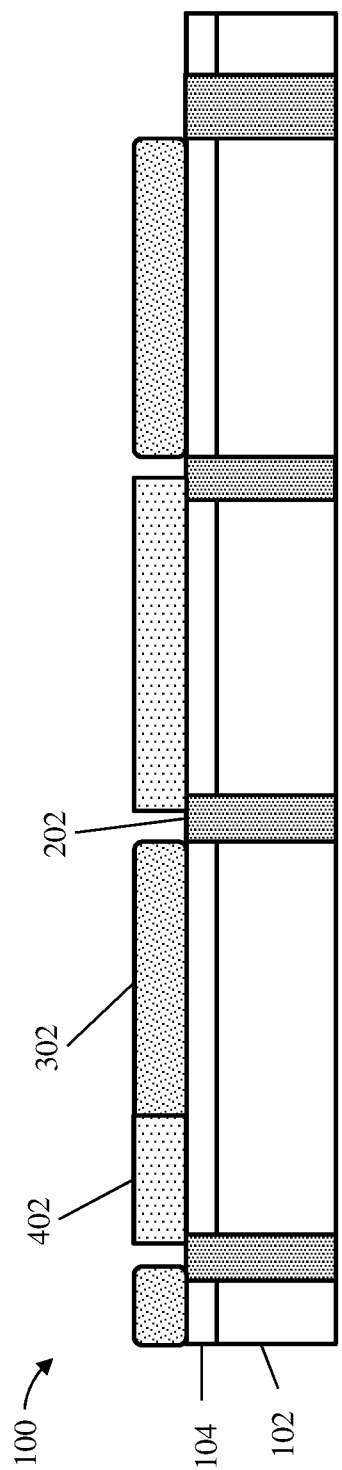
FIG. 4 depicts a cross-sectional view of the semiconductor structure after additional processing operations according to one or more embodiments of the invention.

FIG. 4 depicts a cross-sectional view of the interconnect structure 100 after a processing operation according to one or more embodiments of the invention. In some embodiments of the invention, a growth inhibitor 402 is formed on portions of the line hard mask 104 exposed by the lithographically patterned mask 302. In some embodiments of the invention, growth inhibitor material is selected such that the growth inhibitor 402 only forms on exposed dielectrics. In other words, the growth inhibitor 402 can be selectively formed on exposed portions of the line hard mask 104. In some embodiments of the invention, the host material 202 is a non-dielectric material, and the growth inhibitor 402 leaves a surface of the host material 202 exposed.

In some embodiments of the invention, the growth inhibitor 402 will graft onto a surface of the line hard mask 104 during a spin-coating process. Examples of materials that do not bind to metal surfaces, but that can be deposited onto dielectrics include self-assembled monolayers (e.g., carbon chain C6-C-18) or polymer brush materials (having a molecular weight of 1-10 k) designed with hydroxyl or amine functionality.

Figure 5:
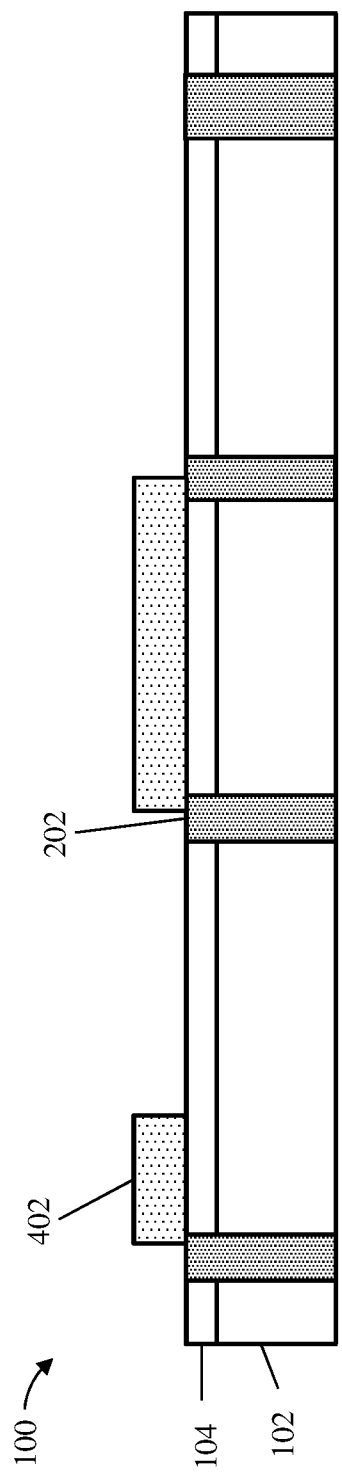
FIG. 5 depicts a cross-sectional view of the semiconductor structure after additional processing operations according to one or more embodiments of the invention.

FIG. 5 depicts a cross-sectional view of the interconnect structure 100 after a processing operation according to one or more embodiments of the invention. In some embodiments of the invention, the lithographically patterned mask 302 is removed to expose a surface of the line hard mask 104.

In some embodiments of the invention, the lithographically patterned mask 302 is removed using a wet etch, a dry etch, a combination of sequential wet and/or dry etches, or a lithographic stripping process. In some embodiments of the invention, the lithographically patterned mask 302 is removed selective to the growth inhibitor 402, the line hard mask 104, and/or the host material 202.

FIG. 6 depicts a cross-sectional view of the interconnect structure 100 after a processing operation according to one or more embodiments of the invention. In some embodiments of the invention, a via mask 602 is formed (deposited) on an exposed surface of the host material 202. In some embodiments of the invention, the via mask 602 can be a metal or dielectric material that is grown using a precise number of growth cycles selected to target a specific via dimension.

In some embodiments of the invention, the via mask 602 can include a material that will not grow on the growth inhibitor 402. In some embodiments of the invention, the via mask 602 can include a material selected such that the via mask 602 will grow on the host material 202, but not on the growth inhibitor 402. Such materials can include, depending on the host material 202, TaN, TiN, Ta, Ti, W, etc. In this manner, the growth inhibitor 402 will prevent the via mask 602 from forming at line ends where a via is not needed.

Figure 7:
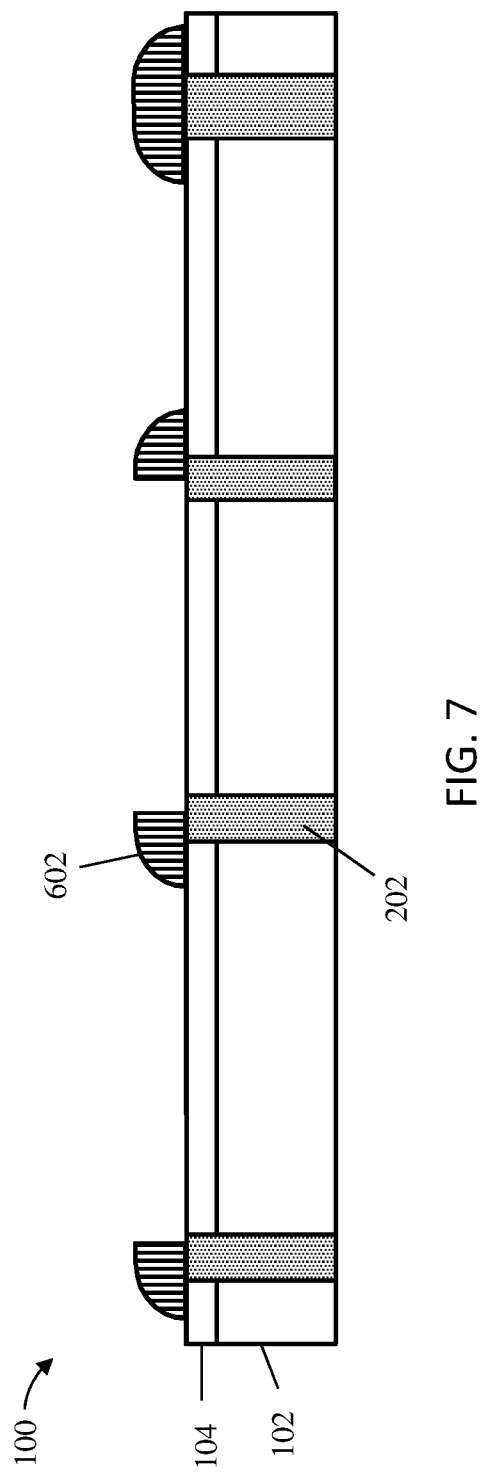
FIG. 7 depicts a cross-sectional view of the semiconductor structure after additional processing operations according to one or more embodiments of the invention.

FIG. 7 depicts a cross-sectional view of the interconnect structure 100 after a processing operation according to one or more embodiments of the invention. In some embodiments of the invention, the growth inhibitor 402 is removed to expose a surface of the line hard mask 104.

In some embodiments of the invention, the growth inhibitor 402 is removed using a wet etch, a dry etch, a combination of sequential wet and/or dry etches, a stripping process, or an ashing process. In some embodiments of the invention, the growth inhibitor 402 is removed selective to the via mask 602, the line hard mask 104, and/or the host material 202. In some embodiments of the invention, the growth inhibitor 402 is selectively removed using an $O_2/N_2—H_2$ ash.

Figure 8:
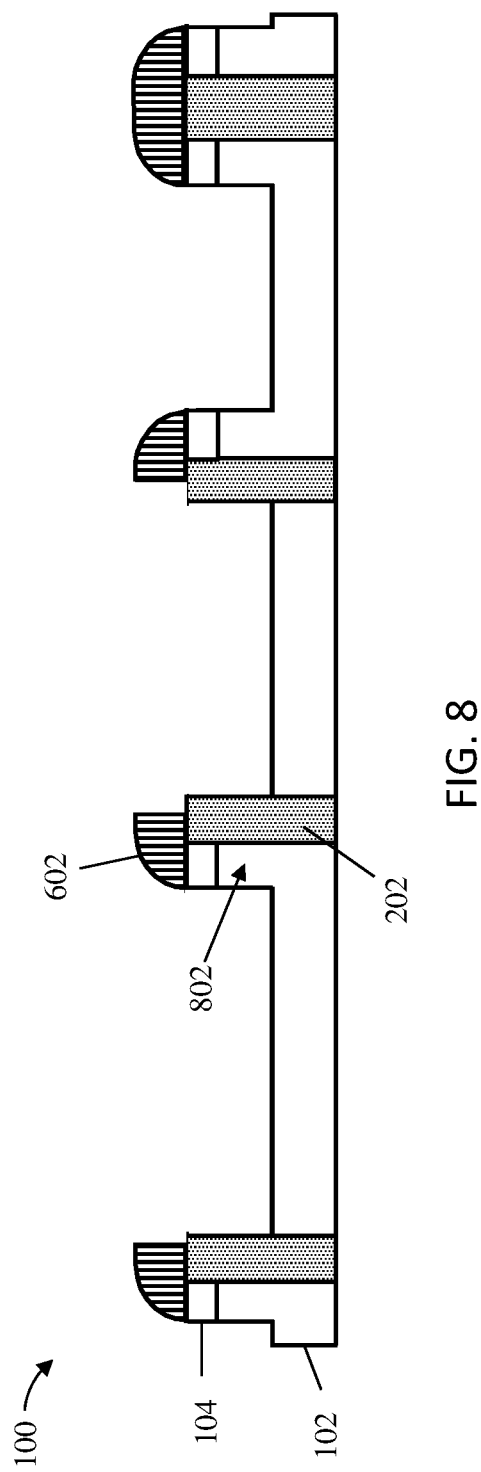
FIG. 8 depicts a cross-sectional view of the semiconductor structure after additional processing operations according to one or more embodiments of the invention.

FIG. 8 depicts a cross-sectional view of the interconnect structure 100 after a processing operation according to one or more embodiments of the invention. In some embodiments of the invention, portions of the line feature 102 and line hard mask 104 that are not covered by the via mask 602 are recessed to form one or more self-aligned top vias 802 at the line ends where the via mask 602 was allowed to form (i.e., where not blocked by the growth inhibitor 402 as discussed with respect to FIGS. 5 and 6).

Advantageously, the top vias 802 are formed by recessing the surface of the line feature 102 selective to the via mask 602. As a result, arbitrarily high aspect ratio (defined as height to width, or H/W) top vias can be formed at the line ends without causing critical dimension variations. The aspect ratio can range from nearly zero (very wide vias) to 5 or even 10 or more (very tall vias to extremely tall vias with relatively small widths).

Figure 9:
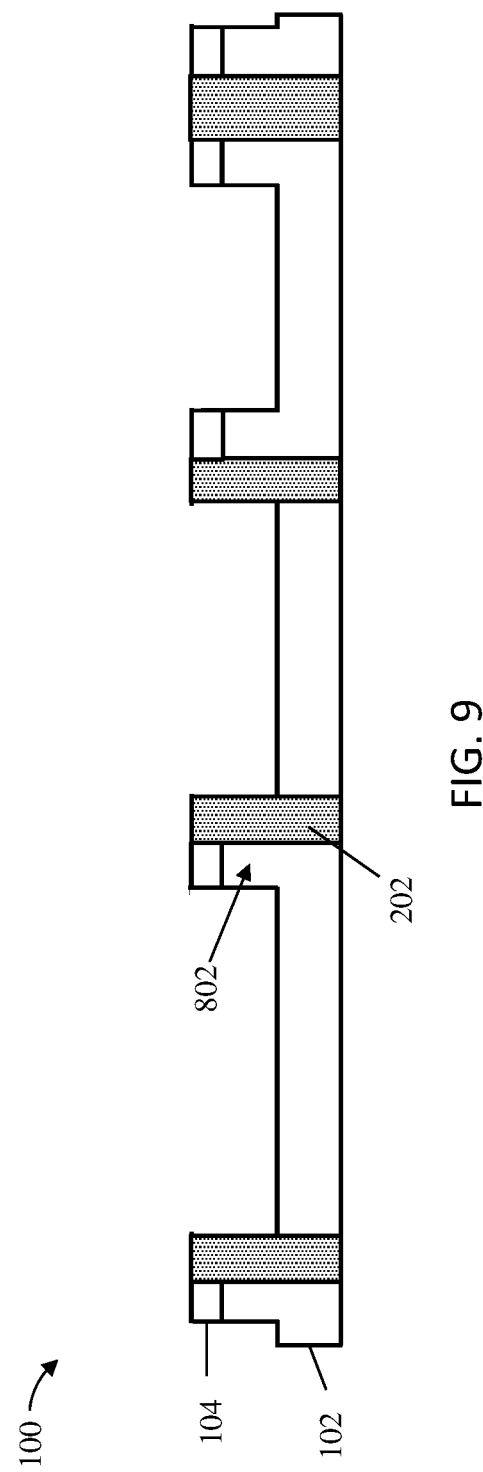
FIG. 9 depicts a cross-sectional view of the semiconductor structure after additional processing operations according to one or more embodiments of the invention.

FIG. 9 depicts a cross-sectional view of the interconnect structure 100 after a processing operation according to one or more embodiments of the invention. In some embodiments of the invention, the via mask 602 is removed to expose a surface of the line hard mask 104 and a surface of the host material 202. In some embodiments of the invention, the via mask 602 is removed using a wet etch, a dry etch, a combination of sequential wet and/or dry etches, a stripping process, or an ashing process. In some embodiments of the invention, the via mask 602 is removed selective to the line hard mask 104, the line feature 102, and/or the host material 202.

Figure 10:
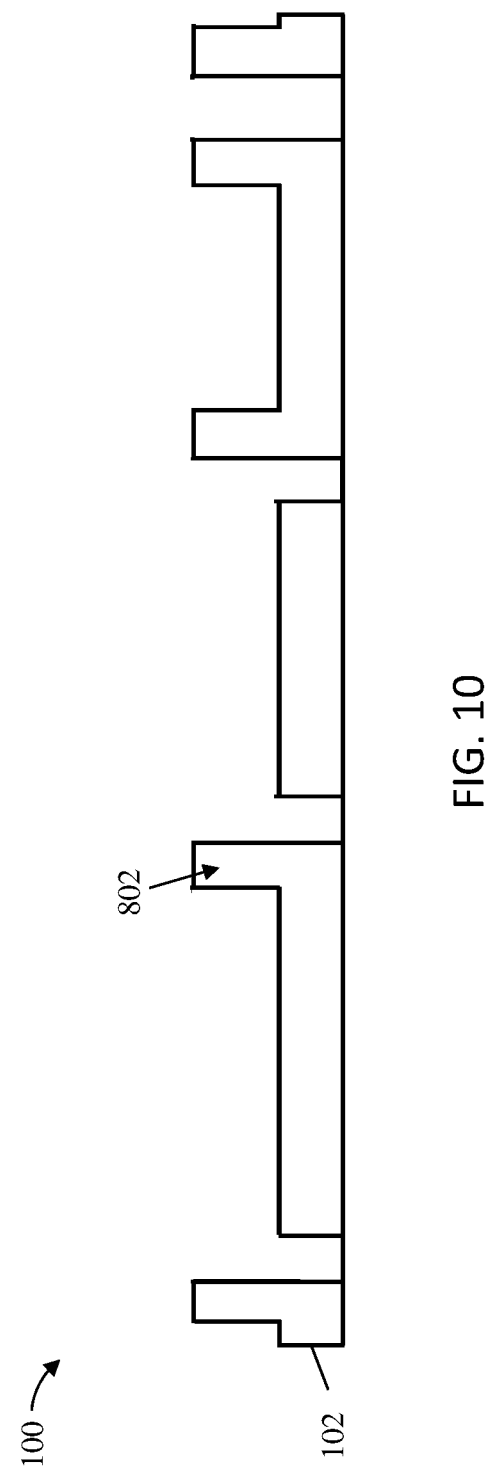
FIG. 10 depicts a cross-sectional view of the semiconductor structure after additional processing operations according to one or more embodiments of the invention.

FIG. 10 depicts a cross-sectional view of the interconnect structure 100 after a processing operation according to one or more embodiments of the invention. In some embodiments of the invention, the line hard mask 104 is removed to expose a surface of the top vias 802. In some embodiments of the invention, the line hard mask 104 is removed using a wet etch, a dry etch, a combination of sequential wet and/or dry etches. In some embodiments of the invention, the line hard mask 104 is removed selective to the line feature 102.

In some embodiments of the invention, the host material 202 remains in the interconnect structure 100. As shown in FIG. 10, however, in some embodiments of the invention, the host material 202 is not compatible with the final product, and is optionally removed. In some embodiments of the invention, the host material 202 is removed using a wet etch, a dry etch, a combination of sequential wet and/or dry etches, a stripping process, or an ashing process. In some embodiments of the invention, the host material 202 is removed selective to the line feature 102.

Figure 11:
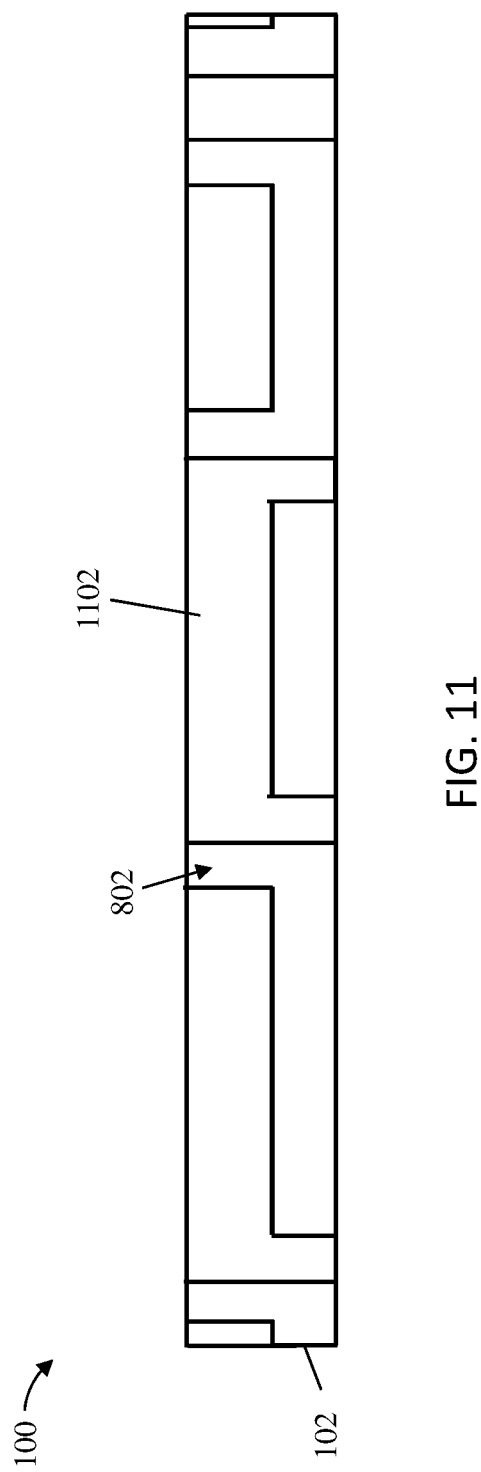
FIG. 11 depicts a cross-sectional view of the semiconductor structure after additional processing operations according to one or more embodiments of the invention.

FIG. 11 depicts a cross-sectional view of the interconnect structure 100 after a processing operation according to one or more embodiments of the invention. In some embodiments of the invention, an interlayer dielectric 1102 can be formed over the interconnect structure 100. The interlayer dielectric 1102 serves as an isolation structure for the lines and vias of the interconnect structure 100. The interlayer dielectric 1102 can be made of any suitable dielectric material, such as, for example, low-k dielectrics (materials having a small dielectric constant relative to silicon dioxide, i.e., less than about 3.9), ultra-low-k dielectrics (materials having a dielectric constant less than 3), porous silicates, carbon doped oxides, silicon dioxides, silicon nitrides, silicon oxynitrides, silicon carbide (SiC), or other dielectric materials. Any known manner of forming the interlayer dielectric 1102 can be utilized, such as, for example, CVD, PECVD, ALD, flowable CVD, spin-on dielectrics, or PVD. In some embodiments of the invention, the interlayer dielectric 1102 is formed above a top surface of the top vias 802 and then planarized to a surface of the top vias 802 using, for example, CMP.

Figure 12:
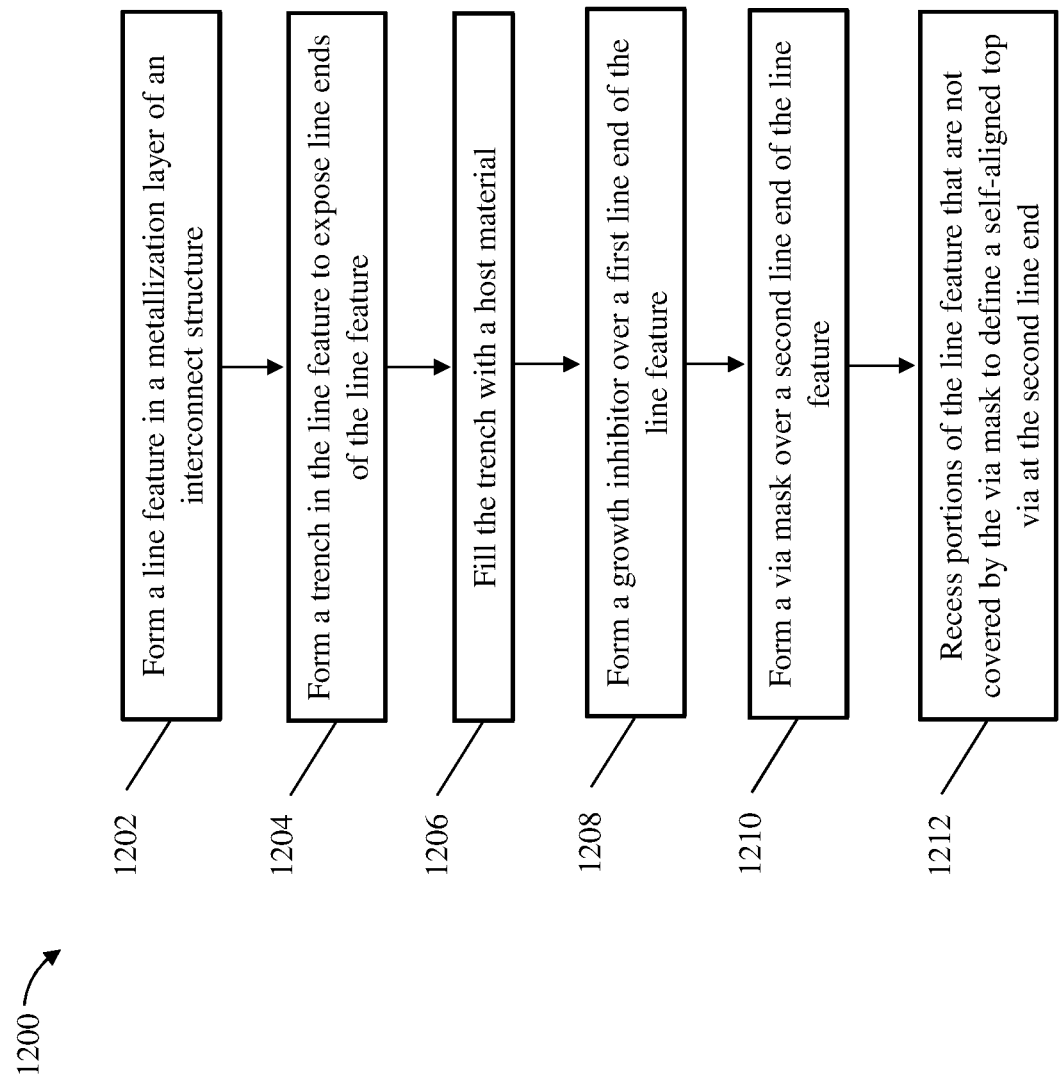
FIG. 12 depicts a flow diagram illustrating a method according to one or more embodiments of the invention.

FIG. 12 depicts a flow diagram 1200 illustrating a method for forming a semiconductor device according to one or more embodiments of the invention. As shown at block 1202, a line feature is formed in a metallization layer of an interconnect structure. In some embodiments of the invention, the line feature includes a line hard mask. In some embodiments of the invention, the line feature includes a metal line.

At block 1204, a trench is formed in the line feature to expose line ends of the line feature. In some embodiments of the invention, forming the trench includes removing portions of the line feature using an etch.

At block 1206, the trench is filled with a host material. In some embodiments of the invention, the host material is selected based on the via mask (step 1210) to ensure that the via mask can selectively grow on a surface of the host material. In some embodiments of the invention, the host material is further selected to include a wets removable non-dielectric material. In some embodiments of the invention, the host material includes titanium nitride or titanium oxide.

At block 1208, a growth inhibitor is formed over a first line end of the line feature. In some embodiments of the invention, the growth inhibitor prevents the via mask from growing at the first line end.

At block 1210, a via mask is formed over a second line end of the line feature. In some embodiments of the invention, the via mask is selectively grown on an exposed surface of the host material. In some embodiments of the invention, the via mask is grown using a number of growth cycles selected to target a predetermined top via dimension.

At block 1212, portions of the line feature that are not covered by the via mask are recessed to define a self-aligned top via at the second line end. In some embodiments of the invention, the line feature is recessed such that a sidewall of the top via is coplanar to a sidewall of the second line end. In some embodiments of the invention, a plurality of top vias are formed on a respective plurality of line ends of the line feature. In some embodiments of the invention, each of the top vias includes a sidewall coplanar to a respective line end. In some embodiments of the invention, one or more of the top vias are positioned over their respective line ends such that three of their planes are co-planar. In other words, two opposite sidewalls and the surface corresponding to the end wall of the top via can be coplanar to the opposite sidewalls and the end wall of the line end.

The method can further include forming a lithographic mask over the line hard mask. The lithographic mask can be patterned to expose the first line end. In some embodiments of the invention, the growth inhibitor is formed on the exposed first line end. In some embodiments of the invention, the growth inhibitor grafts to a surface of the line hard mask but not to a surface of the host material, leaving a surface of the host material exposed.

In some embodiments of the invention, the via mask, the line hard mask, and the host material are replaced with an interlayer dielectric. In some embodiments of the invention, the growth inhibitor is removed prior to recessing portions of the line feature.

Figure 13:
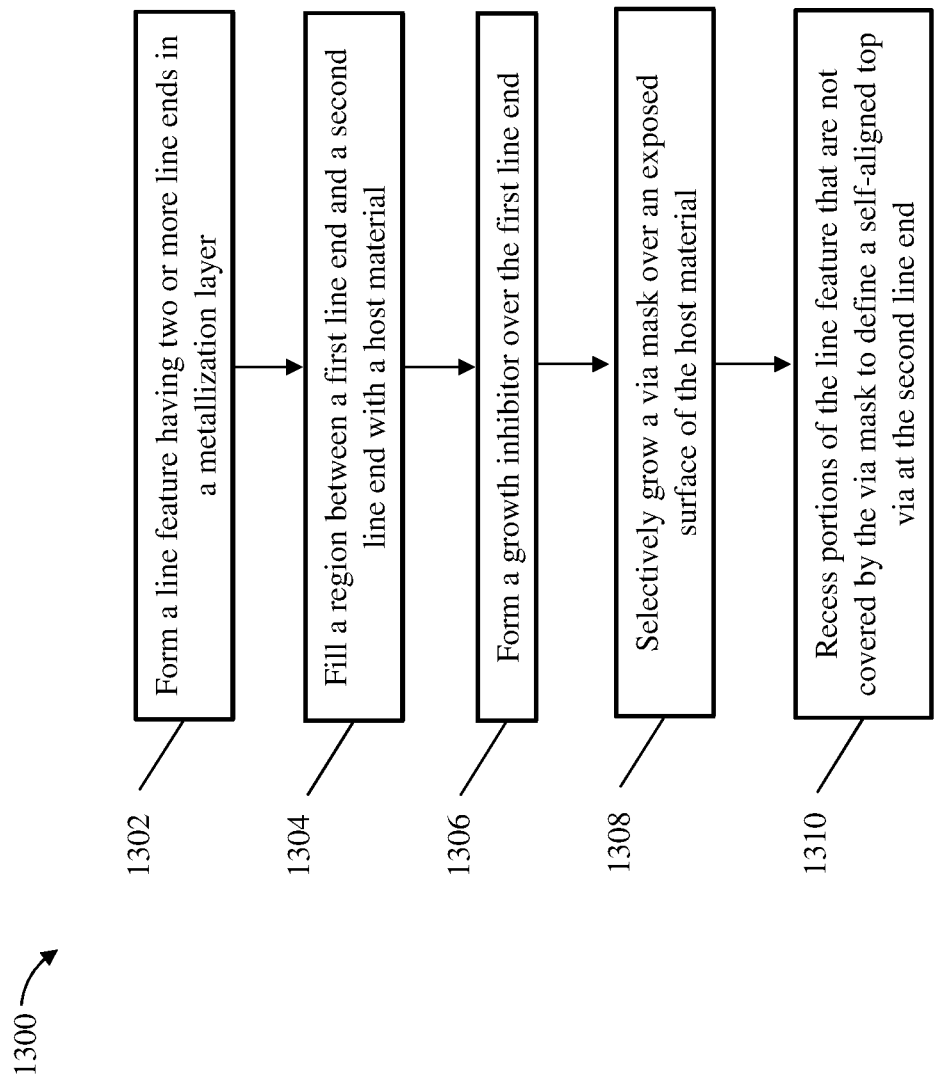
FIG. 13 depicts a flow diagram illustrating a method according to one or more embodiments of the invention.

FIG. 13 depicts a flow diagram 1300 illustrating a method for forming a semiconductor device according to one or more embodiments of the invention. As shown at block 1302, a line feature is formed in a metallization layer. In some embodiments of the invention, the line feature includes two or more line ends. At block 1304, a region between a first line end and a second line end is filled with a host material.

At block 1306, a growth inhibitor is formed over the first line end. In some embodiments of the invention, the growth inhibitor includes a self-assembled monolayer. In some embodiments of the invention, the self-assembled monolayer includes a C6-C-18 carbon chain. In some embodiments of the invention, the growth inhibitor includes a polymer having a molecular weight of about 1 to about 10,000. In some embodiments of the invention, the polymer includes hydroxyl or amine functional groups.

At block 1308, a via mask is selectively grown over an exposed surface of the host material. At block 1310, portions of the line feature that are not covered by the via mask are recessed to define a self-aligned top via at the second line end.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
   forming a line feature in a metallization layer of an interconnect structure, the line feature comprising a line hard mask;
   forming a trench in the line feature to expose line ends of the line feature;
   filling the trench with a host material;
   forming a growth inhibitor over a first line end of the line feature;
   forming a via mask over a second line end of the line feature, the via mask selectively grown on an exposed surface of the host material; and
   recessing portions of the line feature that are not covered by the via mask to define a self-aligned top via at the second line end.

2. The method of claim 1, wherein the via mask is grown using a number of growth cycles selected to target a predetermined top via dimension.

3. The method of claim 1, wherein the growth inhibitor prevents the via mask from growing at the first line end.

4. The method of claim 1, wherein the host material is selected based on the via mask to ensure that the via mask can selectively grow on a surface of the host material.

5. The method of claim 4, wherein the host material is further selected to comprise a wets removable non-dielectric material.

6. The method of claim 5, wherein the host material comprises titanium nitride, titanium oxide, or tantalum nitride.

7. The method of claim 1 further comprising forming a lithographic mask over the line hard mask, the lithographic mask patterned to expose the first line end.

8. The method of claim 7, wherein the growth inhibitor is formed on the exposed first line end.

9. The method of claim 8, wherein the growth inhibitor grafts to a surface of the line hard mask but not to a surface of the host material, leaving a surface of the host material exposed.

10. The method of claim 1 further comprising replacing the via mask, the line hard mask, and the host material with an interlayer dielectric.

11. The method of claim 1, wherein forming the trench comprises removing portions of the line feature using an etch.

12. The method of claim 1, wherein the line feature comprises a metal line.

13. The method of claim 1 further comprising removing the growth inhibitor prior to recessing portions of the line feature.

14. A method for forming an interconnect structure, the method comprising:
   forming a line feature in a metallization layer, the line feature comprising two or more line ends;
   filling a region between a first line end and a second line end with a host material;
   forming a growth inhibitor over the first line end;
   selectively growing a via mask over an exposed surface of the host material; and
   recessing portions of the line feature that are not covered by the via mask to define a self-aligned top via at the second line end.

15. The method of claim 14, wherein the growth inhibitor comprises a self-assembled monolayer.

16. The method of claim 15, wherein the self-assembled monolayer comprises a C6-C-18 carbon chain.

17. The method of claim 14, wherein the growth inhibitor comprises a polymer having a molecular weight of about 1 to about 10,000.

18. The method of claim 17, wherein the polymer comprises hydroxyl or amine functional groups.

* * * * *